United States Patent
Bakken et al.

(10) Patent No.: US 9,160,331 B2
(45) Date of Patent: Oct. 13, 2015

(54) CAPACITIVE AND INDUCTIVE SENSING

(75) Inventors: Vemund Kval Bakken, Menlo Park, CA (US); Trond Jarle Pedersen, Trondheim (NO); Yassar Ali, Sunnyvale, CA (US)

(73) Assignee: Atmel Corporation, San Jose, CA (US)

( * ) Notice: Subject to any disclaimer, the term of this patent is extended or adjusted under 35 U.S.C. 154(b) by 397 days.

(21) Appl. No.: 13/355,013

(22) Filed: Jan. 20, 2012

(65) Prior Publication Data

US 2013/0106769 A1 May 2, 2013

Related U.S. Application Data

(60) Provisional application No. 61/553,114, filed on Oct. 28, 2011.

(51) Int. Cl.
*G06F 3/046* (2006.01)
*G06F 3/044* (2006.01)
*H03K 17/955* (2006.01)
*H03K 17/95* (2006.01)

(52) U.S. Cl.
CPC .............. *H03K 17/955* (2013.01); *G06F 3/044* (2013.01); *G06F 3/046* (2013.01); *H03K 17/9505* (2013.01); *H03K 2217/960775* (2013.01)

(58) Field of Classification Search
CPC ..... G06F 3/0488; G06F 3/044; G06F 3/0421; G06F 3/0436; G06F 3/0418; G06F 3/045; G06F 3/046; G06F 3/0433; G06F 3/041; G06F 3/042
See application file for complete search history.

(56) References Cited

U.S. PATENT DOCUMENTS

| | | | |
|---|---|---|---|
| 4,695,680 A | | 9/1987 | Kable |
| 5,028,745 A | * | 7/1991 | Yamanami et al. ........ 178/18.07 |
| 5,661,269 A | * | 8/1997 | Fukuzaki et al. .......... 178/19.06 |
| 5,973,677 A | | 10/1999 | Gibbons |
| 7,612,767 B1 | | 11/2009 | Griffin |
| 7,663,607 B2 | | 2/2010 | Hotelling |
| 7,875,814 B2 | | 1/2011 | Chen |
| 7,920,129 B2 | | 4/2011 | Hotelling |
| 8,031,094 B2 | | 10/2011 | Hotelling |
| 8,031,174 B2 | | 10/2011 | Hamblin |

(Continued)

FOREIGN PATENT DOCUMENTS

WO  WO 2012/129247  9/2012

OTHER PUBLICATIONS

U.S. Appl. No. 61/454,936, filed Mar. 21, 2011, Myers.

(Continued)

*Primary Examiner* — Quan-Zhen Wang
*Assistant Examiner* — Chad Dicke
(74) *Attorney, Agent, or Firm* — Baker Botts L.L.P.

(57) ABSTRACT

In one embodiment, a method includes in an inductive-sensing mode, by a controller, applying an alternating-current (AC) signal on a first electrode of a capacitive touch sensor. The capacitive touch sensor is configured to operate in the inductive-sensing mode and a capacitive-sensing mode. The method also includes sensing a signal indicative of a magnetic field on the first electrode. The signal is due at least in part to a magnetic field generated by the object and the magnetic field is generated at least in part in response to the AC signal applied on the first electrode. The method also includes determining a position of the object generating the magnetic field based on the signal indicative of the magnetic field.

20 Claims, 6 Drawing Sheets

(56) References Cited

U.S. PATENT DOCUMENTS

| | | |
|---|---|---|
| 8,040,326 B2 | 10/2011 | Hotelling |
| 8,049,732 B2 | 11/2011 | Hotelling |
| 8,179,381 B2 | 5/2012 | Frey |
| 2008/0238885 A1 | 10/2008 | Zachut |
| 2009/0095540 A1 | 4/2009 | Zachut |
| 2009/0115725 A1 | 5/2009 | Shemesh |
| 2009/0127005 A1 | 5/2009 | Zachut |
| 2009/0153152 A1 | 6/2009 | Maharyta |
| 2009/0184939 A1 | 7/2009 | Wohlstadter |
| 2009/0251434 A1 | 10/2009 | Rimon |
| 2009/0315854 A1 | 12/2009 | Matsuo |
| 2010/0006350 A1 | 1/2010 | Elias |
| 2010/0155153 A1 | 6/2010 | Zachut |
| 2010/0292945 A1 | 11/2010 | Reynolds |
| 2010/0315384 A1 | 12/2010 | Hargreaves |
| 2010/0328249 A1* | 12/2010 | Ningrat et al. ............... 345/174 |
| 2011/0007029 A1 | 1/2011 | Ben-David |
| 2011/0298421 A1* | 12/2011 | Palay et al. .................. 320/108 |
| 2012/0242588 A1 | 9/2012 | Myers |
| 2012/0242592 A1 | 9/2012 | Rothkopf |
| 2012/0243151 A1 | 9/2012 | Lynch |
| 2012/0243719 A1 | 9/2012 | Franklin |
| 2012/0327041 A1 | 12/2012 | Harley |

OTHER PUBLICATIONS

U.S. Appl. No. 61/454,950, filed Mar. 21, 2011, Lynch.

U.S. Appl. No. 61/454,894, filed Mar. 21, 2011, Rothkopf.

Kyung, Ki-Uk et al., "wUbi-Pen : Windows Graphical User Interface Interacting with Haptic Feedback Stylus," *SIGGRAPH*, Los Angeles, California, Aug. 2008.

Lee, Johnny C. et al., "Haptic Pen: A Tactile Feedback Stylus for Touch Screens," *UIST '04*, vol. 6, Issue 2, Santa Fe, New Mexico, Oct. 2004.

Song, Hyunyoung et al., "Grips and Gestures on a Multi-Touch Pen," *CHI 2011, Session: Flexible Grips & Gestures*, Vancouver, BC, Canada, May 2011.

Tan, Eng Chong et al., "Application of Capacitive Coupling to the Design of an Absolute-Coordinate Pointing Device," IEEE Transactions on Instrumentation and Measurement, vol. 54, No. 5, Oct. 2005.

* cited by examiner

CAPACITIVE AND INDUCTIVE SENSING

RELATED APPLICATION

This application claims the benefit, under 35 U.S.C. §119 (e), of U.S. Provisional Patent Application No. 61/553,114, filed 28 Oct. 2011, which is incorporated herein by reference.

TECHNICAL FIELD

This disclosure generally relates to touch sensors.

BACKGROUND

A touch-position sensor, or a touch sensor, may detect the presence and location of an object or the proximity of an object (such as a user's finger or a stylus) within a touch-sensitive area of the touch sensor overlaid, for example, on a display screen. In a touch sensitive display application, the touch position sensor may enable a user to interact directly with what is displayed on the screen, rather than indirectly with a mouse or touch pad. A touch sensor may be attached to or provided as a part of a desktop computer, laptop computer, tablet computer, personal digital assistant (PDA), smartphone, satellite navigation device, portable media player, portable game console, kiosk computer, point-of-sale device, or other suitable device. A control panel on a household or other appliance may include a touch sensor.

There are a number of different types of touch position sensors, such as (for example) resistive touch screens, surface acoustic wave touch screens, and capacitive touch screens. Herein, reference to a touch sensor may encompass a touch screen, and vice versa, where appropriate. When an object touches or comes within proximity of the surface of the capacitive touch screen, a change in capacitance may occur within the touch screen at the location of the touch or proximity. A controller may process the change in capacitance to determine its position on the touch screen.

DESCRIPTION OF EXAMPLE EMBODIMENTS

Figure 1:
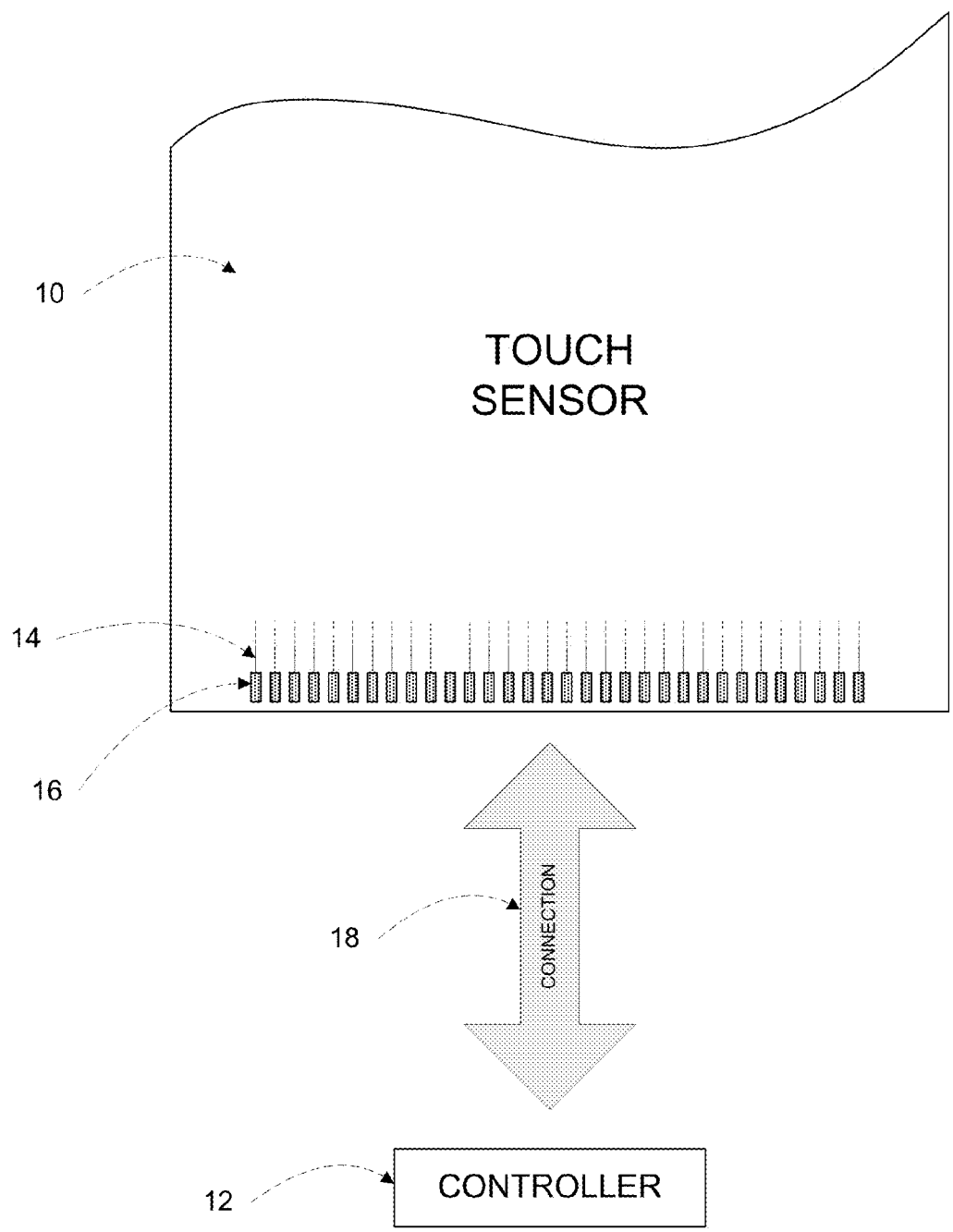
FIG. 1 illustrates an example touch sensor with an example controller.

FIG. 1 illustrates an example touch sensor 10 with an example controller 12. Touch sensor 10 and touch-sensor controller 12 may detect the presence and location of a touch or the proximity of an object within a touch-sensitive area of touch sensor 10. Herein, reference to a touch sensor may encompass both the touch sensor and its touch-sensor controller, where appropriate. Similarly, reference to a touch-sensor controller may encompass both the touch-sensor controller and its touch sensor, where appropriate. Touch sensor 10 may include one or more touch-sensitive areas, where appropriate. Touch sensor 10 may include an array of drive and sense electrodes (or an array of electrodes of a single type) disposed on one or more substrates, which may be made of a dielectric material. Herein, reference to a touch sensor may encompass both the electrodes of the touch sensor and the substrate(s) that they are disposed on, where appropriate. Alternatively, where appropriate, reference to a touch sensor may encompass the electrodes of the touch sensor, but not the substrate(s) that they are disposed on.

An electrode (whether a drive electrode or a sense electrode) may be an area of conductive material forming a shape, such as for example a disc, square, rectangle, other suitable shape, or suitable combination of these. One or more cuts in one or more layers of conductive material may (at least in part) create the shape of an electrode, and the area of the shape may (at least in part) be bounded by those cuts. In particular embodiments, the conductive material of an electrode may occupy approximately 100% of the area of its shape. As an example and not by way of limitation, an electrode may be made of indium tin oxide (ITO) and the ITO of the electrode may occupy approximately 100% of the area of its shape, where appropriate. In particular embodiments, the conductive material of an electrode may occupy substantially less than 100% of the area of its shape. As an example and not by way of limitation, an electrode may be made of fine lines of metal or other conductive material (such as for example copper, silver, or a copper- or silver-based material) and the fine lines of conductive material may occupy substantially less than 100% of the area of its shape in a hatched, mesh, or other suitable pattern. Although this disclosure describes or illustrates particular electrodes made of particular conductive material forming particular shapes with particular fills having particular patterns, this disclosure contemplates any suitable electrodes made of any suitable conductive material forming any suitable shapes with any suitable fills having any suitable patterns. Where appropriate, the shapes of the electrodes (or other elements) of a touch sensor may constitute in whole or in part one or more macro-features of the touch sensor. One or more characteristics of the implementation of those shapes (such as, for example, the conductive materials, fills, or patterns within the shapes) may constitute in whole or in part one or more micro-features of the touch sensor. One or more macro-features of a touch sensor may determine one or more characteristics of its functionality, and one or more micro-features of the touch sensor may determine one or more optical features of the touch sensor, such as transmittance, refraction, or reflection.

A mechanical stack may contain the substrate (or multiple substrates) and the conductive material forming the drive or sense electrodes of touch sensor 10. As an example and not by way of limitation, the mechanical stack may include a first layer of optically clear adhesive (OCA) beneath a cover panel. The cover panel may be clear and made of a resilient material suitable for repeated touching, such as for example glass, polycarbonate, or poly(methyl methacrylate) (PMMA). This disclosure contemplates any suitable cover panel made of any suitable material. The first layer of OCA may be disposed between the cover panel and the substrate with the conductive material forming the drive or sense electrodes. The mechanical stack may also include a second layer of OCA and a dielectric layer (which may be made of PET or another suitable material, similar to the substrate with the conductive material forming the drive or sense electrodes). As an alternative, where appropriate, a thin coating of a dielectric material may be applied instead of the second layer of OCA and the dielectric layer. The second layer of OCA may be disposed between the substrate with the conductive material making up the drive or sense electrodes and the dielectric layer, and the dielectric layer may be disposed between the second layer of OCA and an air gap to a display of a device including touch sensor 10 and touch-sensor controller 12. As an example only and not by way of limitation, the cover panel may have a thickness of approximately 1 millimeter (mm); the first layer of OCA may have a thickness of approximately 0.05 mm; the substrate with the conductive material forming the drive or sense electrodes may have a thickness of approximately 0.05 mm; the second layer of OCA may have a thickness of approximately 0.05 mm; and the dielectric layer may have a thickness of approximately 0.05 mm. Although this disclosure describes a particular mechanical stack with a particular number of particular layers made of particular materials and having particular thicknesses, this disclosure contemplates any suitable mechanical stack with any suitable number of any suitable layers made of any suitable materials and having any suitable thicknesses. As an example and not by way of limitation, in particular embodiments, a layer of adhesive or dielectric may replace the dielectric layer, second layer of OCA, and air gap described above, with there being no air gap to the display.

One or more portions of the substrate of touch sensor 10 may be made of polyethylene terephthalate (PET) or another suitable material. This disclosure contemplates any suitable substrate with any suitable portions made of any suitable material. In particular embodiments, the drive or sense electrodes in touch sensor 10 may be made of ITO in whole or in part. In particular embodiments, the drive or sense electrodes in touch sensor 10 may be made of fine lines of metal or other conductive material. As an example and not by way of limitation, one or more portions of the conductive material may be copper or copper-based and have a thickness of approximately 5 microns (μm) or less and a width of approximately 10 μm or less. As another example, one or more portions of the conductive material may be silver or silver-based and similarly have a thickness of approximately 5 μm or less and a width of approximately 10 μm or less. This disclosure contemplates any suitable electrodes made of any suitable material.

Touch sensor 10 may implement a capacitive form of touch sensing. In a mutual-capacitance implementation, touch sensor 10 may include an array of drive and sense electrodes forming an array of capacitive nodes. A drive electrode and a sense electrode may form a capacitive node. The drive and sense electrodes forming the capacitive node may come near each other, but not make electrical contact with each other. Instead, the drive and sense electrodes may be capacitively coupled to each other across a space between them. A pulsed or alternating voltage applied to the drive electrode (by touch-sensor controller 12) may induce a charge on the sense electrode, and the amount of charge induced may be susceptible to external influence (such as a touch or the proximity of an object). When an object touches or comes within proximity of the capacitive node, a change in capacitance may occur at the capacitive node and touch-sensor controller 12 may measure the change in capacitance. By measuring changes in capacitance throughout the array, touch-sensor controller 12 may determine the position of the touch or proximity within the touch-sensitive area(s) of touch sensor 10.

In a self-capacitance implementation, touch sensor 10 may include an array of electrodes of a single type that may each form a capacitive node. When an object touches or comes within proximity of the capacitive node, a change in self-capacitance may occur at the capacitive node and touch-sensor controller 12 may measure the change in capacitance, for example, as a change in the amount of charge needed to raise the voltage at the capacitive node by a pre-determined amount. As with a mutual-capacitance implementation, by measuring changes in capacitance throughout the array, touch-sensor controller 12 may determine the position of the touch or proximity within the touch-sensitive area(s) of touch sensor 10. This disclosure contemplates any suitable form of capacitive touch sensing, where appropriate.

In particular embodiments, one or more drive electrodes may together form a drive line running horizontally or vertically or in any suitable orientation. Similarly, one or more sense electrodes may together form a sense line running horizontally or vertically or in any suitable orientation. In particular embodiments, drive lines may run substantially perpendicular to sense lines. Herein, reference to a drive line may encompass one or more drive electrodes making up the drive line, and vice versa, where appropriate. Similarly, reference to a sense line may encompass one or more sense electrodes making up the sense line, and vice versa, where appropriate.

Touch sensor 10 may have drive and sense electrodes disposed in a pattern on one side of a single substrate. In such a configuration, a pair of drive and sense electrodes capacitively coupled to each other across a space between them may form a capacitive node. For a self-capacitance implementation, electrodes of only a single type may be disposed in a pattern on a single substrate. In addition or as an alternative to having drive and sense electrodes disposed in a pattern on one side of a single substrate, touch sensor 10 may have drive electrodes disposed in a pattern on one side of a substrate and sense electrodes disposed in a pattern on another side of the substrate. Moreover, touch sensor 10 may have drive electrodes disposed in a pattern on one side of one substrate and sense electrodes disposed in a pattern on one side of another substrate. In such configurations, an intersection of a drive electrode and a sense electrode may form a capacitive node. Such an intersection may be a location where the drive electrode and the sense electrode "cross" or come nearest each other in their respective planes. The drive and sense electrodes do not make electrical contact with each other—instead they are capacitively coupled to each other across a dielectric at the intersection. Although this disclosure describes particular configurations of particular electrodes forming particular nodes, this disclosure contemplates any suitable configuration of any suitable electrodes forming any suitable nodes. Moreover, this disclosure contemplates any suitable electrodes disposed on any suitable number of any suitable substrates in any suitable patterns.

As described above, a change in capacitance at a capacitive node of touch sensor 10 may indicate a touch or proximity input at the position of the capacitive node. Touch-sensor controller 12 may detect and process the change in capacitance to determine the presence and location of the touch or proximity input. Touch-sensor controller 12 may then communicate information about the touch or proximity input to one or more other components (such one or more central processing units (CPUs) or digital signal processors (DSPs)) of a device that includes touch sensor 10 and touch-sensor controller 12, which may respond to the touch or proximity input by initiating a function of the device (or an application running on the device) associated with it. Although this disclosure describes a particular touch-sensor controller having particular functionality with respect to a particular device and a particular touch sensor, this disclosure contemplates any suitable touch-sensor controller having any suitable functionality with respect to any suitable device and any suitable touch sensor.

Touch-sensor controller 12 may be one or more integrated circuits (ICs), such as for example general-purpose microprocessors, microcontrollers, programmable logic devices or arrays, application-specific ICs (ASICs). In particular embodiments, touch-sensor controller 12 comprises analog circuitry, digital logic, and digital non-volatile memory. In particular embodiments, touch-sensor controller 12 is disposed on a flexible printed circuit (FPC) bonded to the substrate of touch sensor 10, as described below. The FPC may be active or passive. In particular embodiments, multiple touch-sensor controllers 12 are disposed on the FPC. Touch-sensor controller 12 may include a processor unit, a drive unit, a sense unit, and a storage unit. The drive unit may supply drive signals to the drive electrodes of touch sensor 10. The sense unit may sense charge at the capacitive nodes of touch sensor 10 and provide measurement signals to the processor unit representing capacitances at the capacitive nodes. The processor unit may control the supply of drive signals to the drive electrodes by the drive unit and process measurement signals from the sense unit to detect and process the presence and location of a touch or proximity input within the touch-sensitive area(s) of touch sensor 10. The processor unit may also track changes in the position of a touch or proximity input within the touch-sensitive area(s) of touch sensor 10. The storage unit may store programming for execution by the processor unit, including programming for controlling the drive unit to supply drive signals to the drive electrodes, programming for processing measurement signals from the sense unit, and other suitable programming, where appropriate. Although this disclosure describes a particular touch-sensor controller having a particular implementation with particular components, this disclosure contemplates any suitable touch-sensor controller having any suitable implementation with any suitable components.

Tracks 14 of conductive material disposed on the substrate of touch sensor 10 may couple the drive or sense electrodes of touch sensor 10 to connection pads 16, also disposed on the substrate of touch sensor 10. As described below, connection pads 16 facilitate coupling of tracks 14 to touch-sensor controller 12. Tracks 14 may extend into or around (e.g. at the edges of) the touch-sensitive area(s) of touch sensor 10. Particular tracks 14 may provide drive connections for coupling touch-sensor controller 12 to drive electrodes of touch sensor 10, through which the drive unit of touch-sensor controller 12 may supply drive signals to the drive electrodes. Other tracks 14 may provide sense connections for coupling touch-sensor controller 12 to sense electrodes of touch sensor 10, through which the sense unit of touch-sensor controller 12 may sense charge at the capacitive nodes of touch sensor 10. Tracks 14 may be made of fine lines of metal or other conductive material. As an example and not by way of limitation, the conductive material of tracks 14 may be copper or copper-based and have a width of approximately 100 μm or less. As another example, the conductive material of tracks 14 may be silver or silver-based and have a width of approximately 100 μm or less. In particular embodiments, tracks 14 may be made of ITO in whole or in part in addition or as an alternative to fine lines of metal or other conductive material. Although this disclosure describes particular tracks made of particular materials with particular widths, this disclosure contemplates any suitable tracks made of any suitable materials with any suitable widths. In addition to tracks 14, touch sensor 10 may include one or more ground lines terminating at a ground connector (which may be a connection pad 16) at an edge of the substrate of touch sensor 10 (similar to tracks 14).

Connection pads 16 may be located along one or more edges of the substrate, outside the touch-sensitive area(s) of touch sensor 10. As described above, touch-sensor controller 12 may be on an FPC. Connection pads 16 may be made of the same material as tracks 14 and may be bonded to the FPC using an anisotropic conductive film (ACF). Connection 18 may include conductive lines on the FPC coupling touch-sensor controller 12 to connection pads 16, in turn coupling touch-sensor controller 12 to tracks 14 and to the drive or sense electrodes of touch sensor 10. In another embodiment, connection pads 16 may be connected to an electro-mechanical connector (such as a zero insertion force wire-to-board connector); in this embodiment, connection 18 may not need to include an FPC. This disclosure contemplates any suitable connection 18 between touch-sensor controller 12 and touch sensor 10.

Figure 2C:
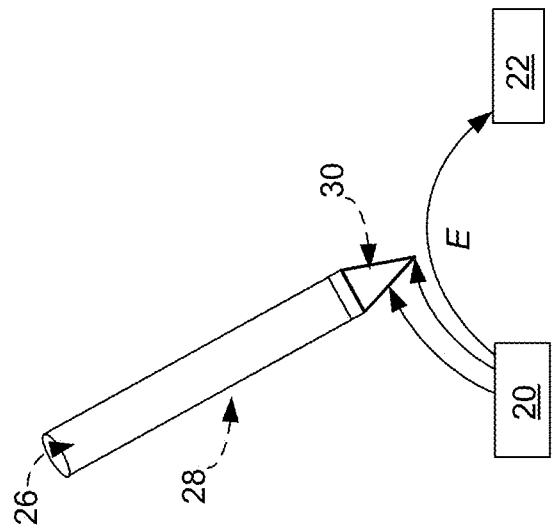
FIGS. 2A-C illustrate example capacitive operation of drive and sense electrodes
Figure 2B:
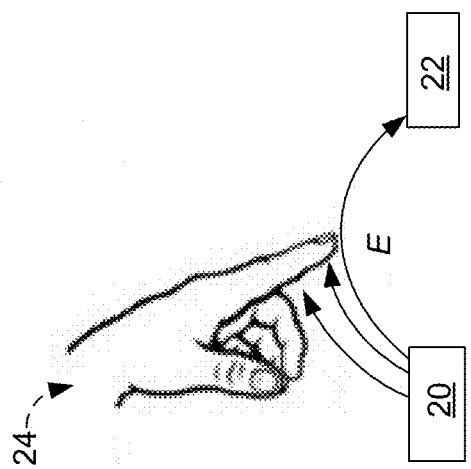
Figure 2A:
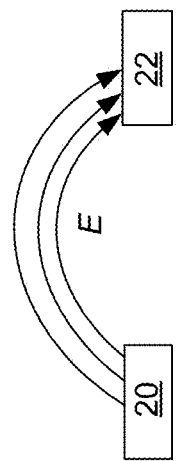

FIGS. 2A-C illustrate example capacitive operation of drive and sense electrodes. In particular embodiments, a capacitive touch sensor 10 may perform inductive and capacitive sensing through appropriate configuration and biasing of drive electrodes 20 and sense electrodes 22. Although this disclosure describes generating particular signals using particular circuitry of a capacitive touch sensor 10, this disclosure contemplates generating suitable signals using any suitable circuitry. In a capacitive-sensing mode, the touch-sensor controller supplies drive signals to drive electrodes 20 of capacitive touch sensor 10 in the form of voltage pulses. In the example of FIG. 2A, the drive signal from the touch-sensor controller generates an electric field E that originates at drive electrodes 20 and is sensed at sense electrodes 22. The resultant signal communicated from sense electrodes 22 to the controller is a voltage proportional to an amount of charge transferred from drive electrodes 20 through capacitive coupling. In the example of FIG. 2B, an object such as for example a finger 24 is placed in proximity to electric field E generated by drive electrodes 20. Since the human body has a high permittivity, the intervening finger 24 diverts a portion of electric field E generated by drive electrodes 20 thereby reducing the amount of charge transferred from drive electrode 20 and sensed by sense electrodes 22. The resultant signal from sense electrodes 22 reflects the change in charge transferred compared to the example of FIG. 2A.

In the example of FIG. 2C, an object such as for example, a stylus 26 is placed in proximity to electric field E generated by drive electrodes 20. As described above, the controller of the touch sensor receives a signal from sense electrodes 22 that is proportional to the amount of charge transferred from drive electrodes 20 through capacitive coupling. The resultant signal from sense electrodes 22 reflects the change in charge transferred compared to the example of FIG. 2A. In contrast to FIG. 2B, the signal sensed on sense electrodes 22 due the intervening stylus 26 depends on an operating mode of stylus 26. In particular embodiments, stylus 26 may contain circuitry that communicates a signal detected by sense electrodes 22 and modifies the drive signal. As an example and not by way of limitation, depending on the transmitted signal from stylus 26, finger 24 or stylus 26 may similarly affect electric field E generated by drive electrodes 20, such that the controller may not be able to readily distinguish between finger 24 and stylus 26 in the capacitive sensing mode.

Figure 3C:
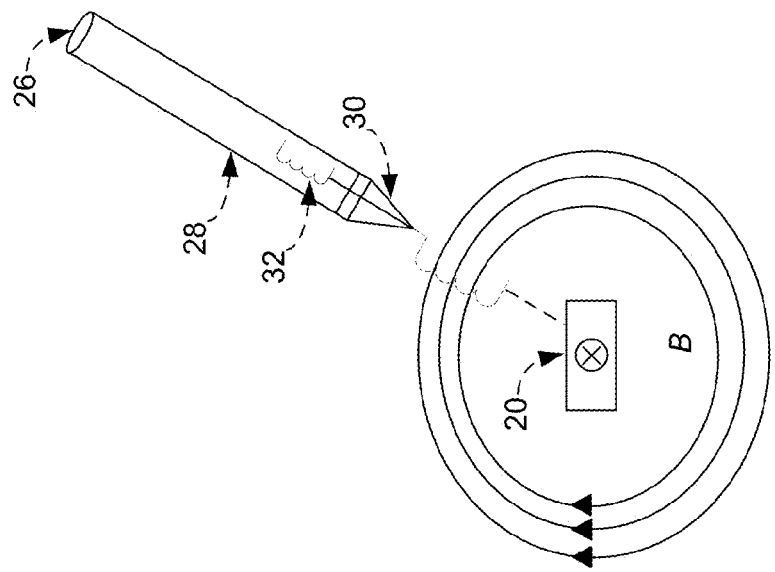
FIG. 3A-C illustrates example generation and interaction with a magnetic field.
Figure 3B:
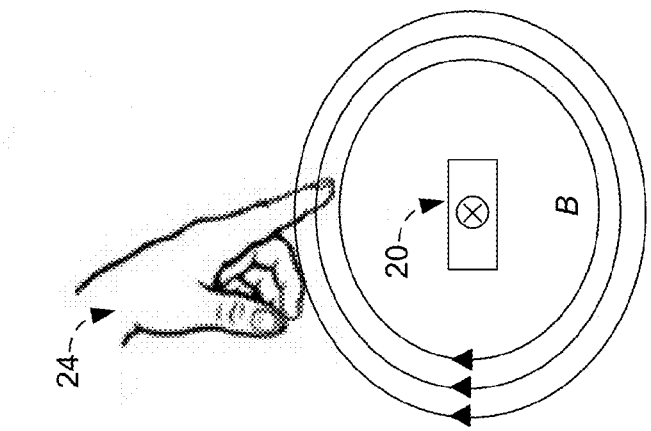
Figure 3A:
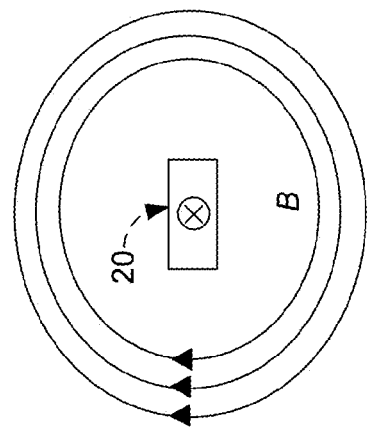

FIG. 3A-C illustrates example generation and interaction with a magnetic field. Although this disclosure describes generating a magnetic field by applying a drive signal to drive electrodes, this disclosure contemplates generating suitable magnetic fields by applying any suitable signal to any suitable electrodes of a touch sensor, including the sense electrodes. In an inductive sensing mode, the touch-sensor controller supplies drive signals to the drive electrodes 20 of the touch sensor in the form of an alternating-current (AC) signal. In the example of FIG. 3A, the drive signal from the touch-sensor controller generates an magnetic field B emanating from drive electrodes 20. Magnetic field B generated by a given current I applied to drive electrode 20 may be approximated by the following equation:

$$B = \frac{\mu_0 I}{4\pi} \int \frac{d\ell \times \hat{r}}{r^2} \quad (1)$$

dl is the direction of current applied to drive electrode 20, $\mu_0$ is the magnetic constant, r is the distance between location of dl and the location where magnetic field B is calculated, and $\hat{r}$ is the unit vector in the direction of r.

In the example of FIG. 3B, an object such as a finger 24 is placed in proximity to magnetic field B generated by drive electrodes 20. Since the human body has a low permeability, the intervening finger 24 does not inductively couple with magnetic field B generated by drive electrodes 22, so that magnetic field B is substantially equal to magnetic field B without finger 24. In the example of FIG. 3C, an object such as for example, stylus 26 with an inductor 32 is placed in proximity to magnetic field B generated by drive electrodes 20. Inductor 32 of intervening stylus 26 couples with least a portion of the magnetic field B generated by drive electrodes 20 and generates a magnetic field that is proportional and synchronized to magnetic field B in response to inductive coupling between magnetic field B and inductor 32. When the AC signal is no longer applied to drive electrodes 20, inductor 32 of stylus 26 continues to generate the proportional magnetic field, which may be detected by sensing a signal at the drive electrode 20.

Figure 4:
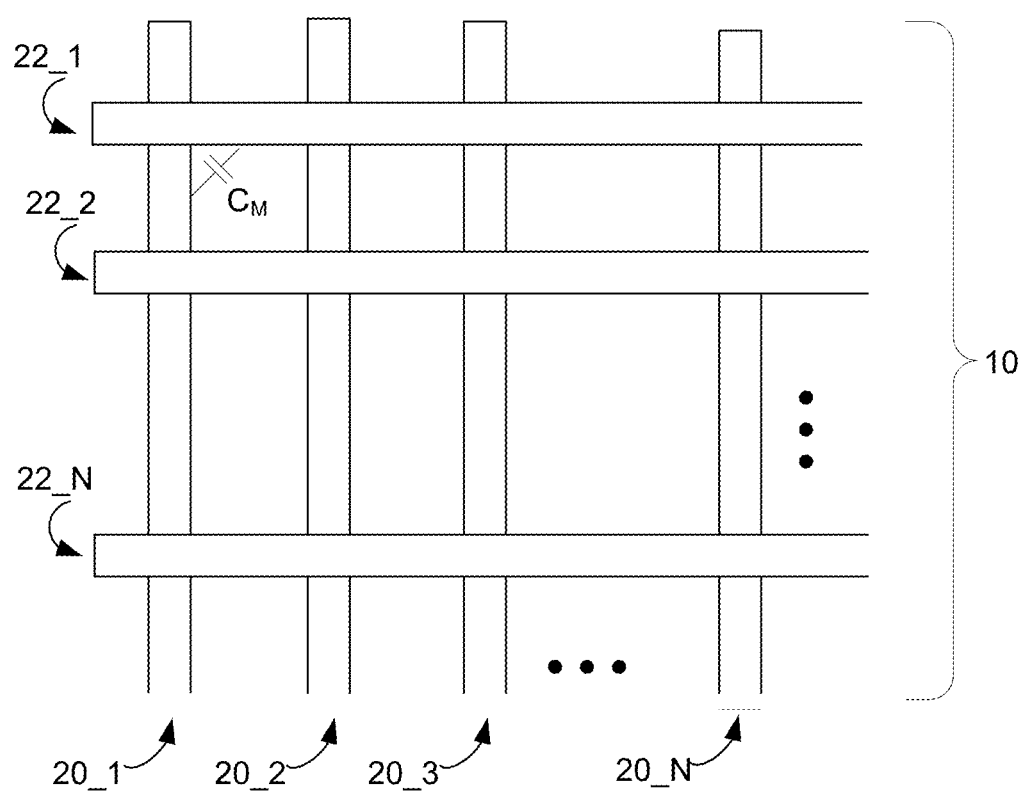
FIG. 4 illustrates an example touch sensor with conductive loops.

FIG. 4 illustrates an example touch sensor with conductive loops. As described above, in the example of FIG. 4, a drive electrode 20_1-N and a sense electrode 22_1-N may form a capacitive node $C_M$. Drive electrodes 20_1-N and sense electrodes 22_1-N forming capacitive node $C_M$ may come near each other, but not make electrical contact with each other. Instead, drive electrodes 20_1-N and sense electrodes 22_1-N may be capacitively coupled to each other across a space between them. In particular embodiments, an example touch sensor 10 may have drive electrodes 20_1-N and sense electrodes 22_1-N formed from open loops of conductive material. As an example and not by way of limitation, conductive material of the electrodes 20_1 and 22_1 is disposed substantially along the periphery of the shape of drive electrodes 20_1-N and sense electrodes 22_1-N thereby forming open loop electrodes. Although this disclosure describes and illustrates a particular layout of conductive material forming a loop in the electrode shape, this disclosure contemplates any suitable layout of conductive material in any suitable electrode shape for generating a magnetic field. As described below, circuitry associated with touch sensor 10 is coupled to open end of drive electrodes 20_1-N and sense electrodes 22_1-N.

Figure 5A:
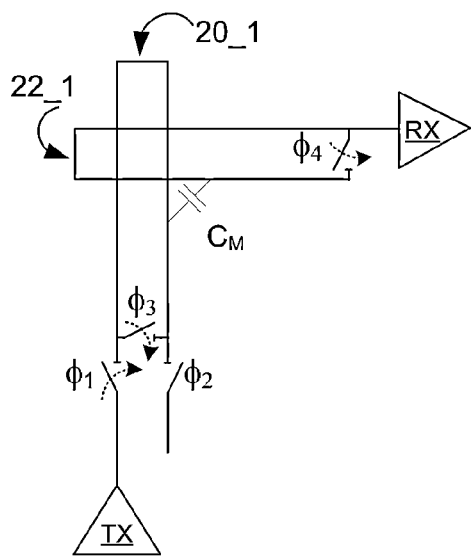
FIG. 5A-B illustrates example configurations of an example touch sensor of FIG. 4.
Figure 5B:
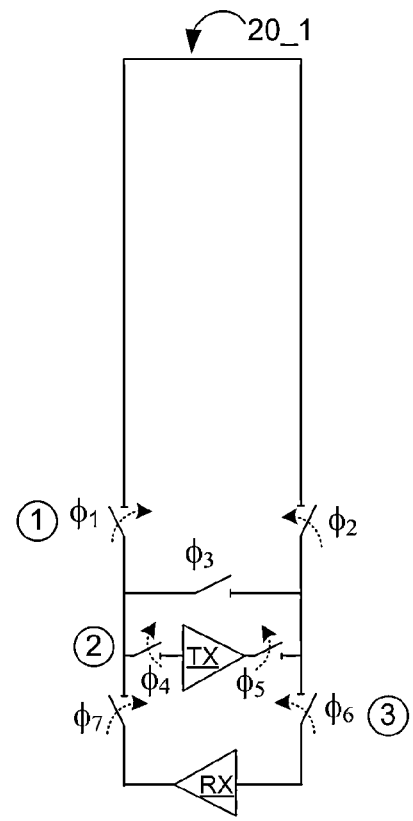

FIG. 5A-B illustrates example configurations of an example touch sensor of FIG. 4. In the example of FIG. 5A, the drive electrodes 20_1 and sense electrodes 22_1 are configured for capacitive sensing. As an example and not by way of limitation, both ends of open-loop drive electrode 20_1 may be coupled together through switch $\phi_3$. Drive unit TX of the touch sensor controller is coupled to one end of open-loop drive electrode 20_1 through switch $\phi_1$. The ends of open-loop sense electrode 22_1 may be coupled together through switch $\phi_4$. Sense unit RX of the touch sensor controller is coupled to one of open-loop sense electrode 22_1. In particular embodiments, for capacitive sensing, switch $\phi_3$ is closed on drive electrode 20_1 and switch $\phi_4$ is closed on sense electrode 22_1. Closing switch $\phi_1$ applies drive signal on the ends of drive electrode 20_1. As an example and not by way of limitation, the drive signal from drive unit TX is a voltage applied to the conductive material of drive electrode 20_1. Since both ends of open-loop drive electrode 20_1 are shorted together through switch $\phi_3$, the drive signal from drive unit TX is applied uniformly to open-loop drive electrode 20_1. As described above, the voltage applied to drive electrode 20_1 affects a voltage sensed on sense electrode 22_1 through capacitive coupling $C_M$ with drive electrode 20_1.

In the example of FIG. 5B, drive electrode 20_1 is configured for inductive sensing. Although this disclosure describes and illustrates inductive sensing through particularly configured drive electrodes (e.g. 20_1), this disclosure contemplates inductive sensing through similarly configured sense electrodes (e.g. 22_1) of the touch sensor. With switches $\phi_1$, $\phi_2$, $\phi_4$, and $\phi_5$ closed and switches $\phi_3$, $\phi_6$ and $\phi_7$ open, open-loop drive electrode 20_1 is coupled to drive unit TX and forms an air core inductor. In particular embodiments, drive unit TX applies a drive signal on one end of open-loop drive electrode 20_1. As an example and not by way of limitation, the drive signal from drive unit TX is an AC signal applied to the conductive material of drive electrode 20_1. As described above, the AC signal applied to drive electrode 20_1 generates a magnetic field B. In particular embodiments, magnetic field B generated by open-loop drive electrode 20_1 is picked up by an intervening stylus that includes an inductor within the outer body of the stylus. The inductor of the stylus inductively couples to magnetic field B generated by open-loop drive electrode 20_1. In particular embodiments, the stylus may include a modulation switch coupled to the inductor. The modulation switch coupled to the inductor may modulate the magnetic field generated by the inductor of the stylus. Moreover by modulating the magnetic field generated by the inductor of the stylus, data may be encoded and communicated from the stylus to a device through the touch sensor.

Opening switches $\phi_4$ and $\phi_5$ decouples drive unit TX and discontinues applying the drive signal to open-loop drive electrode 20_1. When the drive signal is no longer applied to open-loop drive electrode 20_1 by drive unit TX thereby removing the magnetic field generated by open-loop drive electrode 20_1, the inductor of the stylus continues to generate the proportional magnetic field for a period of time. Closing switches $\phi_6$ and $\phi_7$ couples open-loop drive electrode 20_1 to sense unit RX. As an example and not by way of limitation, opening switches $\phi_4$ and $\phi_5$ and closing switches $\phi_6$ and $\phi_7$ is performed after a pre-determined amount of time. Moreover, the pre-determined amount of time corresponds to the amount of time needed for saturate the magnetic field generated by the inductor of the stylus. As described above, the presence of the magnetic field generated by the inductor of the stylus induces a magnetic field on open-loop drive electrode 20_1 that may be measured by the sense unit RX coupled to open-loop drive electrode 20_1. Although this disclosure describes and illustrates capacitive and inductive sensing as separate circuit implementations coupled to particular electrodes of the touch sensor, this disclosure contemplates capacitive and inductive sensing through an integrated circuit implementation coupled to any suitable electrodes of the touch sensor.

In particular embodiments, the controller may process the measured magnetic field information to determine a position of or receive encoded data from the stylus. In other particular embodiments, the inductive-sensing mode is performed by cycling through the entire touch sensor for all drive electrodes 20_1 and sense electrodes 22_1 in a similar fashion as described above. In particular embodiments, the controller of the touch sensor may determine the position of the stylus by detecting the magnetic field generated by the stylus through inductive sensing using drive electrodes 20_1 and sense electrodes 22_1. In contrast, the controller may not be able to determine the presence of a finger due to lack of interaction with magnetic field B generated by electrodes 20_1 and 22_1. Since the stylus has an inductor to inductively couple to magnetic field B generated by electrodes 20_1 and 22_1, the controller is able to isolate a stylus "touch" in the inductive-sensing mode when the stylus and finger are used substantially simultaneously. In particular embodiments, the touch-sensor controller is able to substantially simultaneously detect and differentiate between a stylus "touch" and finger "touch" by time multiplexing between the inductive-sensing mode and capacitive-sensing mode. As an example and not by way of limitation, the controller may determine the position of finger and stylus through the capacitive-sensing mode and subsequently differentiate and isolate the position of stylus through the inductive-sensing mode. Although this disclosure describes and illustrates particular methods using particular electrode and circuit configurations for performing capacitive and inductive sensing, this disclosure contemplates any suitable methods for performing capacitive and inductive sensing using any suitable electrode and circuit configurations.

Figure 6:
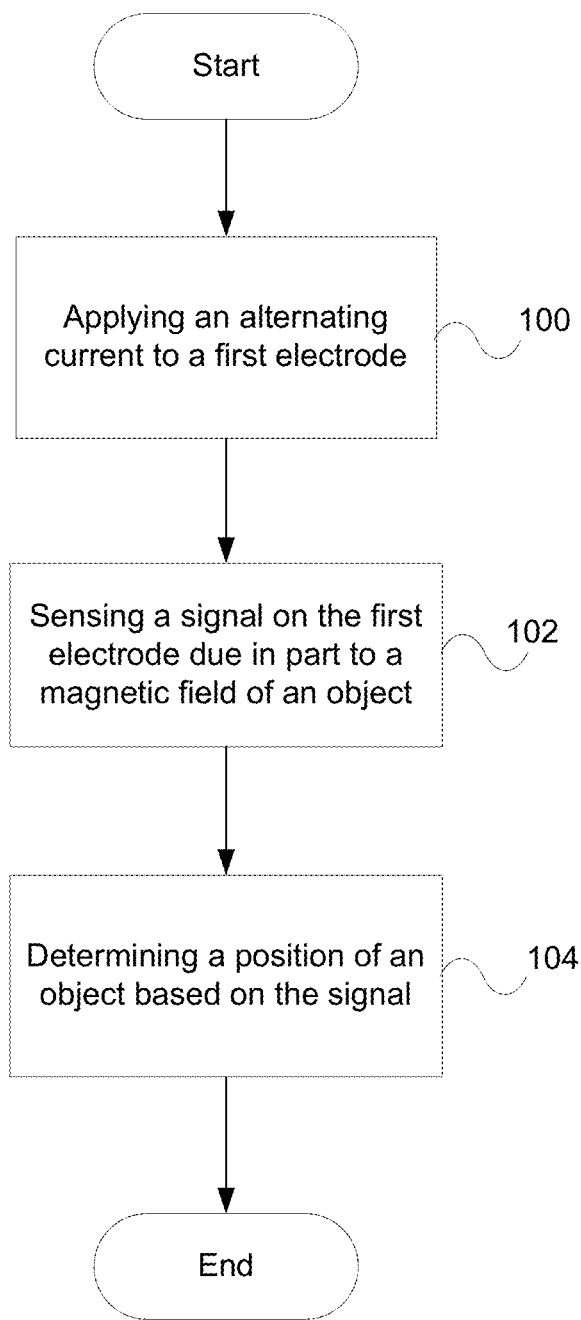
FIG. 6 illustrates an example method for detecting an object through inductive sensing.

FIG. 6 illustrates an example method for detecting an object through inductive sensing. The method starts at step 100, where a controller in an inductive-sensing mode applies an AC current to a first electrode of a touch sensor. In particular embodiments, the touch sensor is a one or two-layer touch-sensor configuration. Step 102 senses a signal indicative of a magnetic field on the first electrode. In particular embodiments, the magnetic field on the first electrode is due at least in part to a magnetic field generated by an inductor of a stylus. At step 104, a position of an object generating the magnetic field is determined based on the signal, at which point the method may end. In particular embodiments, the position of a stylus with the inductor may be detected within a touch-sensitive area of the touch sensor through inductive sensing. Although this disclosure describes and illustrates particular steps of the method of FIG. 6 as occurring in a particular order, this disclosure contemplates any suitable steps of the method of FIG. 6 occurring in any suitable order. Moreover, although this disclosure describes and illustrates particular components carrying out particular steps of the method of FIG. 6, this disclosure contemplates any suitable combination of any suitable components carrying out any suitable steps of the method of FIG. 6.

Herein, reference to a computer-readable storage medium may include a semiconductor-based or other IC (such, as for example, a field-programmable gate array (FPGA) or an ASIC), a hard disk drive (HDD), a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, another suitable computer-readable storage medium, or a suitable combination of two or more of these, where appropriate. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A method comprising:
   in an inductive-sensing mode, by a controller, applying a first alternating-current (AC) signal on a first electrode of a capacitive touch sensor, the capacitive touch sensor configured to operate in the inductive-sensing mode and a capacitive-sensing mode, the first electrode configured, in the capacitive-sensing mode, to operate as a drive electrode, the first electrode coupled, in the inductive sensing mode, to the first AC signal by a first pair of switches;
   sensing, on the first electrode, a first signal indicative of a first magnetic field, the first signal due at least in part to a first magnetic field generated by an object, the first magnetic field generated by the object being generated at least in part in response to the first AC signal applied on the first electrode, the first electrode coupled, in the inductive sensing mode, to a first sensor by a second pair of switches, the second pair of switches different than the first pair of switches;
   in the inductive-sensing mode, by the controller, applying a second AC signal on a second electrode of the capacitive touch sensor, the second electrode configured, in the capacitive-sensing mode, to operate as a sense electrode, the second electrode coupled, in the inductive sensing mode, to the second AC signal by a third pair of switches, the third pair of switches different than the first and second pairs of switches;
   sensing, on the second electrode, a second signal indicative of a second magnetic field, the second signal due at least in part to a second magnetic field generated by the object, the second magnetic field generated by the object being generated at least in part in response to the second AC signal applied on the second electrode, the second electrode coupled, in the inductive sensing mode, to a second sensor by a fourth pair of switches, the fourth pair of switches different than the first, second, and third pairs of switches, the second sensor being one of the first sensor and a sensor different than the first sensor; and
   determining a position of the object generating the first magnetic field and the second magnetic field based on the first signal indicative of the first magnetic field and the second signal indicative of the second magnetic field.

2. The method of claim 1, wherein the object generating the first magnetic field and the second magnetic field is a stylus with an inductor.

3. The method of claim 1, further comprising:
in the capacitive-sensing mode, applying a voltage to the first electrode;
sensing, by the second electrode, a signal indicative of a change in an electric field, the signal due at least in part to an electric field generated at least in part by the voltage applied on the first electrode; and
determining a position of an object with high permittivity based on the signal indicative of the change in the electric field.

4. The method of claim 3, further comprising:
time multiplexing between the inductive-sensing mode and the capacitive-sensing mode; and
isolating an input from the object generating the magnetic field through the time multiplexing between the inductive-sensing mode and the capacitive-sensing mode.

5. The method of claim 1, further comprising receiving data from the object encoded through modulation of one or more of the generated first magnetic field and the generated second magnetic field.

6. The method of claim 1, wherein the first electrode and the second electrode are formed from conductive material disposed along a periphery of an electrode shape.

7. The method of claim 1, further comprising:
coupling the first electrode to a drive unit of the controller for a pre-determined amount of time;
decoupling the first electrode from the drive unit after the pre-determined amount of time; and
coupling the first electrode to a sense unit of the controller for detecting sensing a signal indicative of the magnetic field.

8. A computer-readable non-transitory storage medium embodying logic configured when executed to perform operations comprising:
in an inductive-sensing mode, applying a first alternating-current (AC) signal on a first electrode of a capacitive touch sensor, the capacitive touch sensor configured to operate in the inductive-sensing mode and a capacitive-sensing mode, the first electrode configured, in the capacitive-sensing mode, to operate as a drive electrode, the first electrode coupled, in the inductive sensing mode, to the first AC signal by a first pair of switches;
sensing, on the first electrode, a first signal indicative of a first magnetic field, the first signal due at least in part to a first magnetic field generated by an object, the first magnetic field generated by the object being generated at least in part in response to the first AC signal applied on the first electrode, the first electrode coupled, in the inductive sensing mode, to a first sensor by a second pair of switches, the second pair of switches different than the first pair of switches;
in the inductive-sensing mode, by the controller, applying a second AC signal on a second electrode of the capacitive touch sensor, the second electrode configured, in the capacitive-sensing mode, to operate as a sense electrode, the second electrode coupled, in the inductive sensing mode, to the second AC signal by a third pair of switches, the third pair of switches different than the first and second pairs of switches;
sensing, on the second electrode, a second signal indicative of a second magnetic field, the second signal due at least in part to a second magnetic field generated by the object, the second magnetic field generated by the object being generated at least in part in response to the second AC signal applied on the second electrode, the second electrode coupled, in the inductive sensing mode, to a second sensor by a fourth pair of switches, the fourth pair of switches different than the first, second, and third pairs of switches, the second sensor being one of the first sensor and a sensor different than the first sensor; and
determining a position of the object generating the first magnetic field and the second magnetic field based on the first signal indicative of the first magnetic field and the second signal indicative of the second magnetic field.

9. The medium of claim 8, wherein the object generating the first magnetic field and the second magnetic field is a stylus with an inductor.

10. The medium of claim 8, wherein the logic is further configured to perform operations comprising:
in a capacitive-sensing mode, applying a voltage to the first electrode;
sensing, by the second electrode, a signal indicative of an electric field, the signal due at least in part to the electric field generated at least in part by the voltage applied on the first electrode; and
determining a presence of an object with high permittivity based on the signal indicative of the electric field.

11. The medium of claim 10, wherein the logic is further configured to perform operations comprising:
time multiplexing between the inductive-sensing mode and the capacitive-sensing mode; and
isolating an input from the object generating the magnetic field through the time multiplexing between the inductive-sensing mode and the capacitive-sensing mode.

12. The medium of claim 8, wherein the logic is further configured to perform operations comprising receiving data from the object encoded through modulation of one or more of the generated first magnetic field and the generated second magnetic field.

13. The medium of claim 8, wherein the first electrode and the second electrode are formed from conductive material disposed along a periphery of an electrode shape.

14. The medium of claim 8, wherein the logic is further configured to perform operations comprising:
coupling the first electrode to a drive unit of the controller for a pre-determined amount of time;
decoupling the first electrode from the drive unit after the pre-determined amount of time; and
coupling the first electrode to a sense unit of the controller for detecting sensing a signal indicative of the magnetic field.

15. A device comprising:
a capacitive touch sensor comprising a first electrode and a second electrode, the capacitive touch sensor configured to operate in the inductive-sensing mode and a capacitive-sensing mode; and
a computer-readable non-transitory storage medium coupled to the capacitive touch sensor and embodying logic configured when executed to perform operations comprising:
in the inductive-sensing mode, applying a first an alternating-current (AC) signal on the first electrode, the first electrode configured, in the capacitive-sensing mode, to operate as a drive electrode, the first electrode coupled, in the inductive sensing mode, to the first AC signal by a first pair of switches;
sensing, on the first electrode, a first signal indicative of a first magnetic field, the first signal due at least in part to a first magnetic field generated by an object, the first magnetic field generated by the object being generated at least in part in response to the first AC signal applied on the first electrode, the first electrode coupled, in the inductive sensing mode, to a first sensor by a second pair of switches, the second pair of switches different than the first pair of switches;

in the inductive-sensing mode, by the controller, applying a second AC signal on a second electrode of the capacitive touch sensor, the second electrode configured, in the capacitive-sensing mode, to operate as a sense electrode, the second electrode coupled, in the inductive sensing mode, to the second AC signal by a third pair of switches, the third pair of switches different than the first and second pairs of switches;

sensing, on the second electrode, a second signal indicative of a second magnetic field, the second signal due at least in part to a second magnetic field generated by the object, the second magnetic field generated by the object being generated at least in part in response to the second AC signal applied on the second electrode, the second electrode coupled, in the inductive sensing mode, to a second sensor by a fourth pair of switches, the fourth pair of switches different than the first, second, and third pairs of switches, the second sensor being one of the first sensor and a sensor different than the first sensor; and determining a position of the object generating the first magnetic field and the second magnetic field based on the first signal indicative of the first magnetic field and the second signal indicative of the second magnetic field.

16. The device of claim 15, wherein the object generating the first magnetic field and the second magnetic field is a stylus with an inductor.

17. The device of claim 15, wherein the logic is further configured to perform operations comprising:

in the capacitive-sensing mode, applying a voltage to the first electrode;

sensing, by the second electrode, a signal indicative of an electric field, the signal due at least in part to an electric field generated at least in part by the voltage applied on the first electrode; and determining a presence of an object with high permittivity based on the signal indicative of the electric field.

18. The device of claim 17, wherein the logic is further configured to perform operations comprising:

time multiplexing between the inductive-sensing mode and the capacitive-sensing mode; and isolating an input from the object generating the magnetic field through the time multiplexing between the inductive-sensing mode and the capacitive-sensing mode.

19. The device of claim 15, wherein the first electrode and the second electrode are formed from conductive material disposed along a periphery of an electrode shape.

20. The device of claim 15, wherein the logic is further configured to perform operations comprising:

coupling the first electrode to a drive unit of the controller for a pre-determined amount of time;

decoupling the first electrode from the drive unit after the pre-determined amount of time; and coupling the first electrode to a sense unit of the controller for detecting sensing a signal indicative of the magnetic field.

* * * * *